United States Patent

Utter et al.

[11] Patent Number: 5,819,652
[45] Date of Patent: Oct. 13, 1998

[54] REDUCED CAVITY DEPTH SCREENING STENCIL

[75] Inventors: James Clark Utter, Fishkill; Michael John Matts, Poughkeepsie; Ahmed Sayeed Shah, Wappingers Falls, all of N.Y.

[73] Assignee: International Business Machines Corporation, Armonk, N.Y.

[21] Appl. No.: 355,886

[22] Filed: Dec. 14, 1994

[51] Int. Cl.[6] .................................................. B05C 17/06
[52] U.S. Cl. ..................................... 101/128.21; 428/137
[58] Field of Search ...................... 428/698, 131, 428/134, 137, 457, 704; 427/35, 191, 143, 259, 252; 101/127, 128.1, 128.21, 128.4, 129

[56] References Cited

U.S. PATENT DOCUMENTS

| | | | |
|---|---|---|---|
| 3,769,908 | 11/1973 | Griffin | 101/127 |
| 3,965,277 | 6/1976 | Guditz et al. | 427/43 |
| 4,033,831 | 7/1977 | Bakewell | 101/128.4 |
| 4,084,506 | 4/1978 | Nakatani | 101/127 |
| 4,109,377 | 8/1978 | Blazick et al. | 29/626 |
| 4,134,339 | 1/1979 | Iten | 101/127 |
| 4,242,401 | 12/1980 | Mitani et al. | 101/128.21 |
| 4,270,465 | 6/1981 | Lim | 101/127 |
| 4,287,226 | 9/1981 | Pirvics et al. | 427/54.1 |
| 4,678,531 | 7/1987 | Metzger et al. | 156/250 |
| 4,791,006 | 12/1988 | Galvagni et al. | 427/282 |
| 4,803,110 | 2/1989 | Ahn et al. | 428/137 |
| 4,872,261 | 10/1989 | Sanyal et al. | 29/840 |
| 4,953,460 | 9/1990 | Wojcik | 101/129 |
| 5,073,840 | 12/1991 | Coors | 361/400 |
| 5,116,642 | 5/1992 | Sekiguchi et al. | 427/96 |
| 5,129,573 | 7/1992 | Duffey | 228/180.1 |

FOREIGN PATENT DOCUMENTS

| | | | |
|---|---|---|---|
| 62-139856 | 5/1987 | Japan | B41C 1/14 |
| 62-364 | 7/1987 | Japan | B41N 1/24 |
| 64-203756 | 8/1989 | Japan | B41L 13/08 |

Primary Examiner—Ren Yan
Attorney, Agent, or Firm—Ira D. Blecker

[57] ABSTRACT

An improved mask for screening a conductive paste onto a microelectronic substrate is disclosed. The mask comprises a metal foil having a thickness of less than about 200 microns, having a stencil formed in the foil and extending inwardly to a first depth from a first exterior surface of the foil, said stencil comprising a plurality of voids corresponding to the desired pattern, and having a mesh formed in the foil and extending inwardly to a second depth from a second exterior surface of the foil opposite said first exterior surface, said mesh comprising a plurality of voids in communication with the voids of the stencil, wherein the ratio of said first depth to said second depth is less than 60:40, and wherein the mask is produced from an essentially homogenous metal sheet. Such masks are useful for fabricating microelectronic substrates having screened lines of conductive paste.

5 Claims, 1 Drawing Sheet

REDUCED CAVITY DEPTH SCREENING STENCIL

BACKGROUND OF THE INVENTION

1. Field of the Invention

The present invention generally relates to a metal stencil mask for screen printing, and more particularly, to a stencil mask having a reduced cavity depth for the screening of a conductive paste during the fabrication of microelectronic devices.

2. Discussion of the Related Art

In the fabrication of substrates and carriers for integrated circuit chips, the screen printing of lines of conductive paste onto unfired ceramic substrates or sheets is a well known technique. Screening masks are typically thin sheets of metal such as molybdenum, steel, or copper, having a pattern of voids or openings through which the paste is passed. The voids correspond to the desired pattern of lines to be formed on a device. Among the several types of masks for such applications are masks which comprise a stencil portion, which is placed in contact with the substrate, and a mesh portion which provides support for the stencil portion. Masks formed from a bilayer metal sheet, or a composite sheet are commonly known. Masks formed from an essentially homogeneous single layer metal sheet are less common but have many advantageous characteristics. For instance, emulsion screen masks can not tolerate shear and bending loads, whereas metal stencils can support shear and bending loads, therefore eliminating image distortion problems exhibited by emulsion screen masks. following references illustrate the state of the pertinent art.

U.S. Pat. No. 4,084,506 to Nakatani discloses a trilayer metal mesh mask.

U.S. Pat. No. 4,872,261 to Sanyal, et al. discloses a mask having mesh cavities of different depths in the same mask.

U.S. Pat. No. 4,791,006 to Galvagni, et al. discloses a mask having stencil cavities of different depths in the same mask. Such mask will produce screened paste features wherein the thickness of the line varies.

U.S. Pat. No. 4,803,110 to Ahn, et al., discloses a mesh mask having a coating comprising titanium nitride and the like.

The depth of the voids in the stencil portion of the mask determines the thickness of the lines of conductive paste deposited onto the substrate. The thickness of the conductive paste lines is a very important attribute in an acceptable screened substrate or sheet. Known masks have relatively deep stencil cavities and thus deposit excessive amounts of paste on substrates. Where a substrate is an unfired ceramic sheet or substrate, excessive amounts of paste results in a substrate stability problem. More specifically, the paste solvent can interact with the substrate binder resulting in softening and movement of vias. Via movement is a major problem because it can lead to substrate opens as a result of via columns being vertically misaligned.

None of the known masks has a reduced depth cavity capable of producing screened paste lines of less than about 50 µm thick. Thus, a metal mask having a reduced cavity depth, is needed for use in the screening of conductive paste to produce reduced line heights leading to improved via stability.

SUMMARY OF THE INVENTION

An object of the present invention is to provide improved metal masks having reduced cavity depths.

Another object of the present invention is to provide masks which are particularly suited for methods for depositing less paste during screening.

Yet another object of the present invention is to provide masks fabricated from essentially homogeneous single layer metal sheets.

Yet another object of the present invention is to provide masks which are manufacturably cost effective.

Thus, according to the invention, an improved mask for screening a conductive paste onto a microelectronic substrate is disclosed. In its broadest aspects, the mask comprises a metal foil having a thickness of less than about 200 microns, having a stencil formed in the foil and extending inwardly to a first depth from a first exterior surface of the foil, said stencil comprising a plurality of voids corresponding to the desired pattern, and having a mesh formed in the foil and extending inwardly to a second depth from a second exterior surface of the foil opposite said first exterior surface, said mesh comprising a plurality of voids in communication with the voids of the stencil, wherein the ratio of said first depth to said second depth is less than 60:40, and wherein the mask is produced from an essentially homogenous metal sheet.

Although the instant masks are thin, the mesh layer is nevertheless thick enough to have sufficient mechanical strength to support screening induced loading.

BRIEF DESCRIPTION OF THE DRAWINGS

The aforementioned aspects and other features of the invention are explained in the following description, taken in connection with the accompanying drawings wherein.

DETAILED DESCRIPTION OF THE PREFERRED EMBODIMENTS

The disclosure of U.S. Pat. No. 4,803,110 to Ahn, et al., is hereby incorporated by reference.

Figure 1:
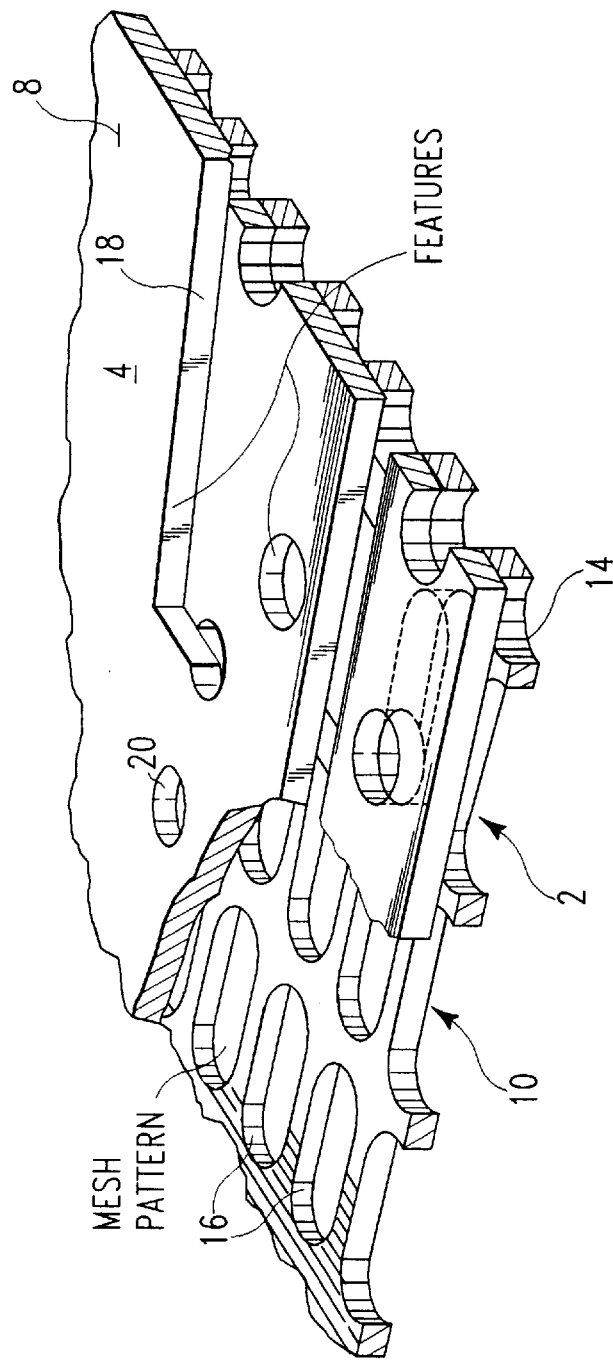
FIG. 1 shows a fragmentary view of the mask.
Figure 2:
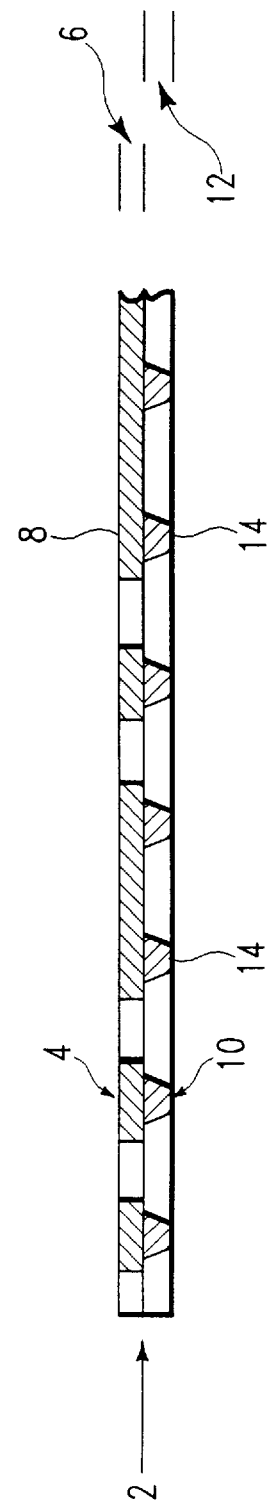
FIG. 2 shows a cross sectional view of the mask.

Referring now to FIGS. 1 and 2, there is shown one embodiment of a metal stencil mask according to the invention comprising a metal sheet or foil (2), which sheet comprises a stencil layer (4) formed in the foil (2) and extending inwardly to a first depth (6) from a first exterior surface (8) of the foil (2) and a mesh layer (10) formed in the foil (2) and extending inwardly to a second depth (12) from a second exterior surface (14) of the foil (2) opposite said first exterior surface (8). The stencil layer (4) comprises a plurality of voids (18 and 20). The voids may be linear features (18) or via features (20) corresponding to the complementary features in the desired pattern. The mesh layer (10) comprises a plurality of voids (16) in communication with the voids (18 and 20) of the stencil layer. the present invention, the metal mask (2) will have a total thickness of less than about 200 microns, and will be produced from an essentially homogenous metal sheet. By essentially homogenous is meant that the metal sheet, foil, or blank, from which the mask is produced, is a single layer of material before etching the features of the mask. The masks of the present invention are not produced from starting materials which are multiple layer sheets, nor from sheets having a textile, polymer, or composite layer. The ratio of the first depth (6) of the voids (18 and 20) in the stencil layer (4), which defines the thickness of said stencil layer, to the second depth (12) of the voids (16) in the mesh layer (10), which defines the thickness of said mesh layer, is less than 60:40. For example, a mask (2) having a stencil layer thickness (6) (the depth of the voids in the stencil layer controls the screened paste height) of about 20 μm and a mesh layer thickness (12) of about 80 μm satisfies the aforesaid thickness ratio requirement.

In an alternative embodiment, the depth (6) of the cavity in the stencil layer (4) of the mask (2) is less than about 50 μm. In a preferred alternative embodiment, the depth (6) of the cavity in the stencil layer (4) of the mask (2) is less than about 40 μm. In more preferred alternative embodiment, the depth (6) of the cavity in the stencil layer (4) of the mask (2) is less than about 25 μm. In a still more preferred alternative embodiment, the depth (6) of the cavity in the stencil layer (4) of the mask (2) is less than about 15 μm.

The masks of the invention can be fabricated by well known processes wherein the patterns of the voids are defined by a photolithographic process and the voids in each layer are then etched. The masks are etched by a wet etching process using aqueous $K_3Fe(CN)_6$. Cavity depth control is achieved by varying the time each side of a stencil is exposed to etchant.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A metal stencil mask for screening a paste material therethrough to form a desired pattern of the paste material on a substrate, the mask comprising:
   a) a metal foil having a thickness of less than about 200 microns;
   b) a stencil formed in the foil and extending inwardly to a first depth from a first exterior surface of the foil, said stencil comprising a first plurality of voids corresponding to the desired pattern; and
   c) a mesh formed in the foil and extending inwardly to a second depth from a second exterior surface of the foil opposite said first exterior surface, said mesh comprising a second plurality of voids in communication with the first plurality of voids of the stencil, the ratio of said first depth to said second depth being less than 60:40, and the mask being produced from an essentially homogeneous metal sheet.

2. The metal stencil mask of claim 1 wherein said first depth of said stencil is less than about 50 μm.

3. The metal stencil mask of claim 1 wherein said first depth of said stencil is less than about 40 μm.

4. The metal stencil mask of claim 1 wherein said first depth of said stencil is less than about 25 μm.

5. The metal stencil mask of claim 1 wherein said first depth of said stencil is less than about 15 μm.

* * * * *